United States Patent
Funayama et al.

(10) Patent No.: US 8,125,128 B2
(45) Date of Patent: Feb. 28, 2012

(54) ELECTROLUMINESCENCE ELEMENT AND LIGHTING APPARATUS

(75) Inventors: Katsuya Funayama, Kanagawa (JP); Keishin Handa, Kanagawa (JP); Kenichirou Motoda, Kanagawa (JP)

(73) Assignee: Mitsubishi Chemical Corporation, Tokyo (JP)

( * ) Notice: Subject to any disclaimer, the term of this patent is extended or adjusted under 35 U.S.C. 154(b) by 714 days.

(21) Appl. No.: 11/908,138

(22) PCT Filed: Mar. 2, 2006

(86) PCT No.: PCT/JP2006/303972
§ 371 (c)(1),
(2), (4) Date: Sep. 10, 2007

(87) PCT Pub. No.: WO2006/095632
PCT Pub. Date: Sep. 14, 2006

(65) Prior Publication Data
US 2009/0072733 A1    Mar. 19, 2009

(30) Foreign Application Priority Data
Mar. 11, 2005  (JP) ................... 2005-069487

(51) Int. Cl.
*H05B 33/02* (2006.01)
(52) U.S. Cl. ..................... 313/116; 313/506
(58) Field of Classification Search ............ 257/40, 257/72, 98–100, 642–643, 759; 313/498–512, 313/110–117; 315/169.1, 169.3; 427/58, 427/64, 66, 532–535, 539; 428/690–691, 428/917; 438/26–29, 34, 82, 455; 445/24–25
See application file for complete search history.

(56) References Cited

U.S. PATENT DOCUMENTS 5,955,837 A * 9/1999 Horikx et al. ............ 313/506
2003/0020399 A1 * 1/2003 Moller et al. ............ 313/504
(Continued)

FOREIGN PATENT DOCUMENTS
EP    1 424 739    6/2004
(Continued)

OTHER PUBLICATIONS

Japanese Office Action issued Nov. 2, 2010 in connection with corresponding Japanese Application No. 2006-056483, filed Mar. 2, 2006.

(Continued)

*Primary Examiner* — Nimeshkumar Patel
*Assistant Examiner* — Donald Raleigh
(74) *Attorney, Agent, or Firm* — Oblon, Spivak, McClelland, Maier & Neustadt, L.L.P.

(57) ABSTRACT

An electroluminescent element wherein an electrode 1, an electroluminescent layer 2, a high-refractive-index layer 3 (a transparent electrode layer 3A and an intermediate layer 3B) and a translucent body 4 are sequentially laminated. On light-emitting-surface side of the high-refractive-index layer 3 and the translucent body 4, layers 5A and 5B individually having a light-scattering function are provided respectively. The presence of the light-scattering layers 5A and 5B on the light-emitting-surface side of the high-refractive-index layer 3 and the translucent body 4 enables to emit light from the electroluminescent element through multiple scattering of guided light, which travels inside the translucent body 4 in the planar direction while being totally reflected by the interface between the translucent body 4 and air, and other guided light, which travels inside a thin film including the electroluminescent layer 2 and the high-refractive-index layer 3.

17 Claims, 1 Drawing Sheet

U.S. PATENT DOCUMENTS

| | | | |
|---|---|---|---|
| 2004/0241421 A1* | 12/2004 | Ootsuka et al. | 428/323 |
| 2005/0093437 A1* | 5/2005 | Ouyang | 313/506 |
| 2005/0142379 A1* | 6/2005 | Juni et al. | 428/690 |
| 2006/0147715 A1* | 7/2006 | Lee et al. | 428/411.1 |

FOREIGN PATENT DOCUMENTS

| | | |
|---|---|---|
| EP | 1 435 762 | 7/2004 |
| JP | 2931211 | 5/1999 |
| JP | 2000 503163 | 3/2000 |
| JP | 2003 59642 | 2/2003 |
| JP | 2003-142262 | 5/2003 |
| JP | 2003 234178 | 8/2003 |
| JP | 2004-22438 | 1/2004 |
| JP | 2004 513483 | 4/2004 |
| JP | 2004 296429 | 10/2004 |
| JP | 2004-296438 | 10/2004 |
| JP | 2004 303724 | 10/2004 |
| JP | 2004 319331 | 11/2004 |
| JP | 2005 63704 | 3/2005 |
| WO | 03 026357 | 3/2003 |

OTHER PUBLICATIONS

Miura, et al., "P-191: Out Coupling Efficiency Enhancement of Organic Light Emitting Devices with Novel Periodic Nanostructures Using Nanoimprint Lithography", SID 06 Digest, pp. 946-949, 2006.

* cited by examiner

PRIOR ART

ELECTROLUMINESCENCE ELEMENT AND LIGHTING APPARATUS

TECHNICAL FIELD

The present invention relates to electroluminescent elements, and in particular, to an electroluminescent element excellent in terms of the light emission efficiency. The present invention also relates to a lighting apparatus having the electroluminescent element as its light source.

BACKGROUND ART

In general, electroluminescent elements used in electroluminescent displays and electroluminescent lighting apparatuses emit light on the basis of the principle of recombination of positive holes injected from an anode and electrons injected from a cathode in an electroluminescent layer and subsequent excitation of the luminescence center caused by the recombination energy.

Figure 2:
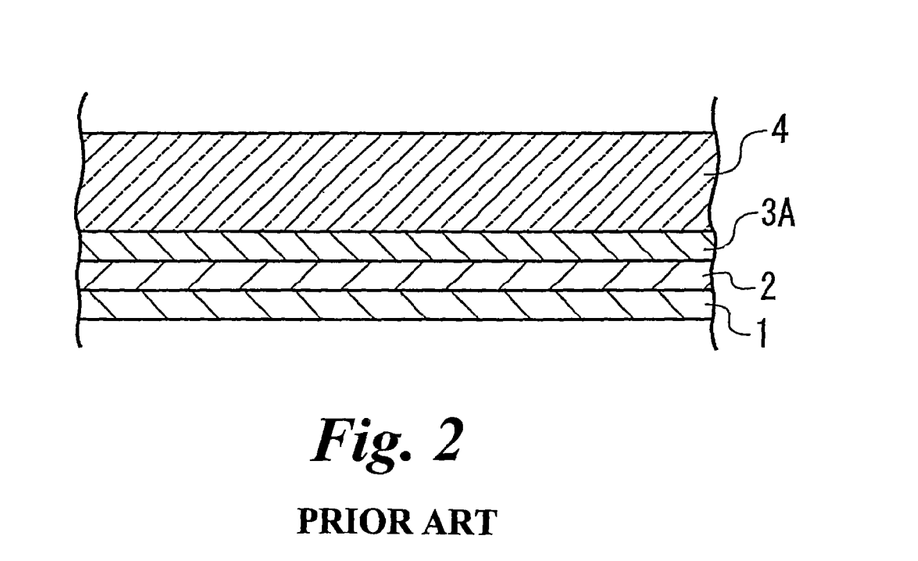
[FIG. 2] A schematic sectional view of a known electroluminescent element.

FIG. 2 is a schematic sectional view of a known general electroluminescent element, wherein an electrode (cathode) 1, an electroluminescent layer 2, a transparent electrode layer (anode) 3A and a translucent body (transparent substrate) are sequentially laminated.

In electroluminescent displays, it is preferable that the light generated in the electroluminescent layer is emitted with a high efficiency. However, the light emitted at an angle close to the critical angle included in the generated light is totally reflected by the interface between the light-emitting surface, i.e., the transparent substrate, and air, and thus becomes guided light (substrate mode) that travels inside the transparent substrate in the planar direction while being totally reflected. There is also other guided light (thin film mode), which travels inside the transparent electrode layer or the transparent electrode and electroluminescent layers in the planar direction while being totally reflected by the interface between the transparent electrode layer and the transparent substrate. These kinds of guided light are attenuated due to absorption in the element and thus can not be output.

The presence of these kinds of guided light has lowered the efficiency with which light is emitted from the transparent substrate of known electroluminescent elements (ratio of the amount of light emitted from the electroluminescent element to the total amount of light generated in the electroluminescent layer) to as low as approximately 20%.

Patent Document 1 discloses an organic electroluminescent apparatus that has a light-scattering portion formed of a lens sheet in its transparent substrate or has a matte substrate, as a technique for reducing the amount of these kinds of guided light. However, although this technique can reduce the amount of the guided light traveling inside the translucent body in the planar direction while being totally reflected by the interface between the translucent body and air, the other guided light, which travels inside the transparent electrode layer or the transparent electrode and electroluminescent layers in the planar direction while being totally reflected by the interface between the transparent electrode layer and the transparent substrate, can not be output, thus reducing the light emission efficiency.

Patent Document 2 discloses an information display wherein frustrating elements are provided in order to eliminate the internal total reflection of light. In this technique the frustrating elements that contain bulky diffusing material and are placed at several sites within the device can slightly improve the light emission efficiency, but potential contact between the textured interface and the transparent electrode would cause a lot of problematic dark spots, which may also shorten the life of the element, to form on the light-emitting surface. In addition, the guided light that travels inside the transparent electrode layer or the transparent electrode and electroluminescent layers in the planar direction while being totally reflected by the interface between the transparent electrode layer and the transparent substrate can not be output, thus reducing the light emission efficiency, just like the technique described in Patent Document 1.

Patent Document 1: Japanese Patent No. 2931211
Patent Document 2: PCT Japanese Translation Patent Publication No. 2004-513483

DISCLOSURE OF INVENTION

The present invention provides electroluminescent elements, wherein an electrode, an electroluminescent layer, a high-refractive-index layer and a translucent body are sequentially laminated; the amount of guided light that travels inside the high-refractive-index layer or the high-refractive-index and electroluminescent layers in the planar direction while being totally reflected by the interface between the high-refractive-index layer and the translucent body is reduced as well as guided light that travels inside the translucent body in the planar direction while being totally reflected by the interface between the translucent body and air; and thereby the efficiency with which light is emitted from the electroluminescent element is improved.

This invention provides, in particular, an electroluminescent element in which decrease in brightness at the edge of image elements, which are required in a lighting apparatus using an electroluminescent element as its light source, can be avoided and directed light can be output.

Another object of the present invention is to offer a lighting apparatus using such an electroluminescent element as its light source.

The electroluminescent element of the first aspect is an electroluminescent element, wherein an electrode, an electroluminescent layer, a high-refractive-index layer and a translucent body are sequentially laminated, and on the light-emitting-surface side of each of the high-refractive-index layer and the translucent body, a layer having a light-scattering function is provided.

The lighting apparatus of the second aspect is a lighting apparatus using the electroluminescent element of the first aspect as its light source.

DETAILED DESCRIPTION

The inventors found that, in an electroluminescent element, providing a layer with a light-scattering function on the respective light-emitting-surface sides of the high-refractive-index layer and the translucent body can reduce the amount of guided light that travels inside the high-refractive-index layer or the high-refractive-index and electroluminescent layers in the planar direction while being totally reflected by the interface between the high-refractive-index layer and the translucent body as well as guided light that travels inside the translucent body in the planar direction while being totally reflected by the interface between the translucent body and air, thereby significantly improving the efficiency with which light is emitted from the electroluminescent element, and completed this invention.

Detailed mechanisms how the layers having the light-scattering function on the light-emitting-surface sides of the high-refractive-index layer and the translucent body reduce the light emission efficiency are unclear. However, the provided layers having the light-scattering function on the light-emitting-surface side of the high-refractive-index layer and the translucent body may realize multiple scattering of guided light that travels inside the translucent body in the planar direction while being totally reflected by the interface between the translucent body and air, and other guided light that travels inside a thin film containing the electroluminescent layer and the high-refractive-index layer, thereby making it possible to emit light from the electroluminescent element.

The electroluminescent element of the present invention offers the following effects i) to vi).
  i) The light emission efficiency is significantly improved when compared to known electroluminescent elements.
  ii) Variation in the luminescent color and brightness caused by optical interference associated with changes in the view angle can be reduced. The variation in the luminescent color and brightness depending on the view angle is significant particularly in white electroluminescent elements (electron-transporting layer-based electroluminescent elements, hole-transporting layer/electron-transporting layer-based electroluminescent elements and tandem electroluminescent elements), and the present invention can greatly reduce this variation.
  iii) Lower precision in the uniformity of film thickness of each layer contained in an electroluminescent element may be acceptable and at the same time, displays using these elements can be easily enlarged and mass-produced at lower costs.
  iv) The variation in the light emission status due to temperature characteristics or deterioration of the elements can be reduced. Therefore, even the partial replacement of deteriorated elements used in a lighting apparatus results in no changes in their characteristics.
  v) Decrease in brightness at the edge of image elements used in a lighting apparatus can be avoided, so that the lighting apparatus can always provide light with uniform intensity.
  vi) The light having improved brightness and desired directivity can be taken out.

The electroluminescent element of the present invention offers brighter light with a smaller amount of the current, thereby providing long-life elements. The high brightness obtained also makes it possible to use the electroluminescent elements as light emitters in displays, lighting apparatuses and other applications.

The electroluminescent element of the present invention can reduce the decrease in brightness at the edge of image elements and emit directed light, and thus is the most suitable for lighting applications.

The electroluminescent element of the present invention spontaneously emits light and thus can be used in field emission displays and plasma displays having a translucent body. Therefore, the industrial applicability of these elements is very high.

Embodiments of the electroluminescent element and the lighting apparatus according to the present invention are described in detail below. However, the following statement of configuration requirements is an example (representative example) of embodiments of the present invention, so that this invention is not limited to these embodiments as long as they fall within the scope of the invention.

[Configuration of the Electroluminescent Element]

A configuration of the electroluminescent element according to the present invention is described below with reference to FIG. 1.

Figure 1:
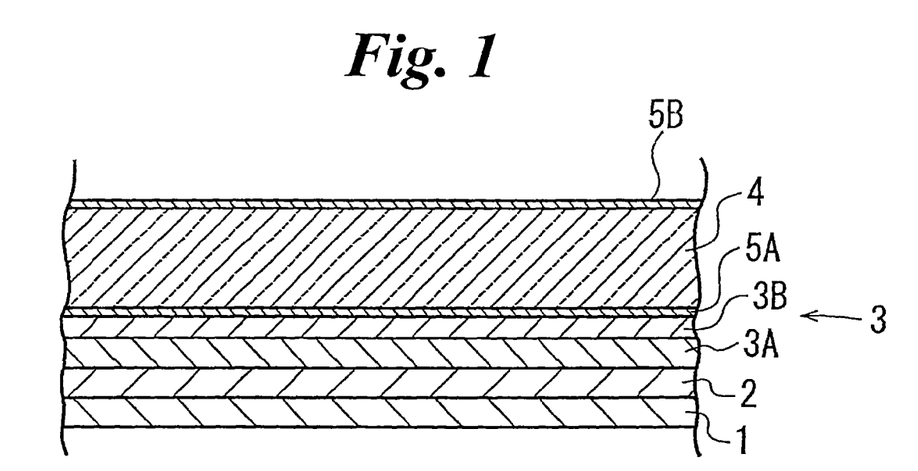
[FIG. 1] A schematic sectional view of an electroluminescent element according to an embodiment of the present invention.

FIG. 1 is a schematic sectional view of the electroluminescent element according to the embodiment of the present invention.

In the electroluminescent element of the present invention, an electrode 1, an electroluminescent layer 2, a high-refractive-index layer 3 and a translucent body 4 are sequentially laminated and on the light-emitting-surface side of the high-refractive-index layer 3 and the translucent body 4, layers 5A and 5B having a light-scattering function are provided respectively.

The electroluminescent element of the present invention may have any other layers between the individual component layers unless the effects of the present invention are impaired.

Components of the electroluminescent element according to the present invention are explained below.

Electrode
In general, the electrode 1 serves as a cathode. Preferred material used as the cathode is metal having a low work function or a compound thereof. The cathode is typically formed of aluminum, tin, magnesium, indium, calcium, gold, silver, copper, nickel, chrome, palladium, platinum, a magnesium-silver alloy, a magnesium-indium alloy, an aluminum-lithium alloy or other material, with more preferred material being aluminum.

Thickness of the cathode is not particularly limited, but typically 10 nm or more, preferably 30 nm or more, and more preferably 50 nm or more, and at the same time, typically 1000 nm or less, preferably 500 nm or less, and more preferably 300 nm or less.

The cathode can be obtained by a vacuum film-forming process, such as vapor deposition and sputtering.

Laminating a layer of metal having a high work function and being stable in air on the side other than the electroluminescent layer side for the purpose of protecting the cathode formed of metal having a low work function is an effective approach to improve the stability of the element. To this end, aluminum, silver, copper, nickel, chrome, gold, platinum and other metals are used. In addition, inserting an ultrathin insulating film (film thickness 0.1 to 5 nm) of LiF, $MgF_2$, $Li_2O$ or other compounds between the cathode and the electroluminescent layer can improve the efficiency of the element.

Another configuration in which the cathode is formed of transparent electrode material such as indium oxide and zinc oxide containing indium, and light is emitted from the cathode side may be employed. In this configuration, the light-emitting-surface sides of high-refractive-index layer and the translucent body are located at the cathode side.

Electroluminescent Layer

The electroluminescent layer 2 is formed of film(s) of material that emits light when receiving a voltage, and may include one or more films having different functions.

Examples of the films include a hole-injecting layer, a hole-transporting layer, a light-emitting layer, an electron-transporting layer and an electron-injecting layer. Material used in the electroluminescent layer may be commonly used electroluminescent material, e.g., known inorganic electroluminescent material such as activated zinc oxide ZnS:X (X is Mn, Tb, Cu, Sm or other activator elements), CaS:Eu, SrS:Ce, $SrGa_2S_4$:Ce, $CaGa_2S_4$:Ce, CaS:Pb and $BaAl_2S_4$:Eu; organic electroluminescent material classified into low-molecularweight dyes such as aluminum complexes of 8-hydroxyquinoline, aromatic amines and anthracene single crystals; and organic electroluminescent material classified into conjugated polymer such as poly(p-phenylenevinylene), poly[2-methoxy-5-(2-ethylhexyloxy-1,4-phenylenevinylene], poly(3-alkylthiophene) and polyvinylcarbazole, but not limited to those described above. Besides these light-emitting compounds, material capable of emitting phosphorescence in a triplet state or compounds derived from these kinds of fluorescent dyes may be used.

Thickness of the electroluminescent layer 2 is typically 10 nm or more, preferably 30 nm or more, and more preferably 50 nm or more, and at the same time, typically 1000 nm or less, preferably 500 nm or less, and more preferably 200 nm or less.

The electroluminescent layer 2 can be formed by a vacuum film-forming process such as by vapor deposition and sputtering, or by an application process using chloroform or other compounds as solvent.

High-Refractive-Index Layer

The high-refractive-index layer 3 in the present invention is provided in order to output guided light traveling inside the thin film including the electroluminescent layer 2 in the planar direction, and its refractive index is typically 1.55 or higher, preferably 1.6 or higher, more preferably 1.7 or higher, even more preferably 1.9 or higher and most preferably 2.0 or higher, and at the same time, typically 2.5 or lower and preferably 2.2 or lower. The high-refractive-index layer may be formed of two or more layers, and in such a case the refractive index represents the mean value calculated from all the layers included. It should be noted that the refractive index in the present invention is measured using a spectral ellipsometer (wavelength: 350 to 900 nm), except for cases using a prism coupler for samples difficult to measure and analyze.

The high-refractive-index layer 3 includes at least a transparent electrode layer 3A. The high-refractive-index layer 3 may consist of only the single transparent electrode layer 3A or may be a combined layer of the transparent electrode layer 3A and an intermediate layer 3B having a comparable refractive index as shown in FIG. 1.

In the present invention, the high-refractive-index layer 3 preferably consists of the transparent electrode layer 3A and the intermediate layer 3B having a comparable refractive index since guided light traveling inside the thin film including the electroluminescent layer 2 should be transferred to also the high-refractive-index layer 3. In this description the term "comparative refractive index" means a refractive index differing from the other by less than 0.3, preferably by 0.2 or less, more preferably by 0.1 or less, and most preferably by 0.02 or less.

Thickness of the high-refractive-index layer 3 is typically 200 nm or more and preferably 600 nm or more, and at the same time, typically 100 μm or less, preferably 50 μm or less, and more preferably 10 μm or less. Thickness smaller than 200 nm makes it difficult to control the interface between the transparent electrode layer 3A and the intermediate layer 3B, thereby possibly resulting in black spot formation during light emission and a short life of the element. On the other hand, thickness larger than 50 μm may reduce transmittance or may cause light to leak. Therefore, the high-refractive-index layer 3 has only a sufficient thickness to achieve appropriate surface smoothness described below.

A surface (transparent-electrode-layer side) of the high-refractive-index layer is preferably smooth, and its surface roughness Ra is preferably 80 nm or less, more preferably 50 nm or less, and most preferably 30 nm or less. The surface roughness Ra larger than 80 nm may cause black spot formation during electroluminescent light emission and a short life of the element. However, it is difficult to make a surface having a surface roughness Ra smaller than 0.1 and thus the surface roughness Ra is preferably 0.1 nm or larger. The surface roughness Ra of the high-refractive-index layer 3 can be observed using a contact surface profiler (KLB-Tencor Corporation).

Transparent Electrode Layer

The transparent electrode layer 3A usually acts as an anode of the electroluminescent element. As the transparent electrode layer 3A, a thin film formed of indium oxide containing tin (commonly called ITO), zinc oxide containing aluminum (commonly called AZO), zinc oxide containing indium (commonly called IZO) or other types of combined oxides is preferably used. In particular, ITO is the most preferable one.

When using a transparent electrode layer that does not have a light-scattering function described later by itself, the larger transmittance for parallel lights having visible wavelength the better, and the parallel light transmittance is typically 50% or more, preferably 60% or more, and more preferably 70% or more.

The smaller electrical resistance as surface resistance of the transparent electrode layer 3A the better, and the surface resistance is typically 1 to $100\Omega/\square(=1\ cm^2)$. Its upper limit is preferably $70\Omega/\square$, and more preferably $50\Omega/\square$.

Thickness of the transparent electrode layer 3A is typically 0.01 to 10 μm as far as the layer meets the abovementioned requirements for light transmittance and surface resistance. Considering the conductivity, however, the thickness is preferably 0.03 μm or more, and more preferably 0.05 μm or more. On the other hand, the thickness is preferably 1 μm or less, and more preferably 0.5 μm or less from the perspective of ensuring the light transmittance.

Examples of components contained in a coating agent used to form the transparent electrode layer 3A include, but are not limited to, a dispersion fluid prepared by mixing ITO fine particles and conductive polymer or other resin binders with organic medium, and conductive polymer material. The transparent electrode layer 3A is formed into a pattern required for an electrode of the electroluminescent element by using such a coating agent via photolithography, ink-jet printing or other techniques. The standard width of each patterned line is 1 to 10 μm, but not limited to this range.

Intermediate Layer Having a Refractive Index Comparable with that of the Transparent Electrode Layer (Hereinafter, Abbreviated to an Intermediate Layer)

The intermediate layer 3B may be formed on either the light-emitting-surface side, as shown in FIG. 1, or the electroluminescent-layer 2 side of the transparent electrode layer 3A, or otherwise, two layers may be formed on both sides. Formed on the light-emitting-surface side of the transparent electrode layer 3A, the intermediate layer 3B preferably has insulation properties. Formed on the electroluminescent-layer 2 side, the intermediate layer 3B preferably has conductivity. It should be noted that, in a more preferable configuration, the intermediate layer 3B having insulating properties is formed on the light-emitting-surface side of the transparent electrode layer 3A.

The intermediate layer 3B is a film formed by the sol-gel reaction or vacuum processes, and examples of its material include inorganic oxide material such as $SiN_xO_y$ (x and y are positive integers or zero), $TiO_2$, $ZrO_2$ and zeolite, organic material such as thermosetting resins, UV-curable resins and conductive resins, as well as composite material thereof. The intermediate layer 3B may be a laminated product of these materials. Material of the intermediate layer 3B is not particularly limited, but may be material that has a refractive index adjusted in advance by dispersing fine particles of high-refractive-index compounds such as $TiO_2$, $Al_2O_3$, $ZrO_2$ and $Ta_2O_3$ in a matrix such as resin or silicate, since the layer should be similar to the transparent electrode layer 3A in terms of the refractive index. One or more kinds of the fine particles may be used. Specific examples of the resin constituting the matrix include polyethylene, polypropylene, polyethylene terephthalate, polymethyl methacrylate, polystyrene, polyethersulfone, polyarylate, polycarbonate resins, polyurethane, acryl resins, polyacrylonitrile, polyvinyl acetal, polyamide, polyimide, diacrylphthalate resins, cellulose resins, polyvinyl chloride, polyvinylidene chloride, polyvinyl acetate and other thermoplastic resins, as well as copolymer containing two or more kinds of monomers of the resins described above.

The intermediate layer 3B should have a refractive index comparable with that of the transparent electrode layer 3A and a differential refractive index of 0.3 or more may result in insufficient emission of guided light from the thin film including the electroluminescent layer 2. Therefore, it is important that the difference in refractive index between the transparent electrode layer 3A and the intermediate layer 3B is less than 0.3, preferably 0.2 or less, more preferably 0.1 or less, and most preferably 0.02 or less.

Thickness of the intermediate layer 3B is typically 250 nm or more, preferably 600 nm or more, and at the same time, typically 50 μm or less and preferably 10 μm or less.

The intermediate layer 3B can be usually obtained by an application process such as spin-coating, dip-coating and die-coating, or a vacuum process such as vapor deposition and sputtering.

A surface of the intermediate layer is preferably smooth, and its surface roughness Ra is preferably 100 nm or less, more preferably 50 nm or less, and most preferably 10 nm or less. The surface roughness larger than 100 nm may result in black spot formation during electroluminescent light emission and a short life of the element. However, it is difficult to make a surface having surface roughness Ra smaller than 0.05 nm and thus the surface roughness Ra of the intermediate layer 3B is typically 0.05 nm or larger. The surface roughness Ra of the intermediate layer 3B can be observed using a contact surface profiler (KLB-Tencor Corporation).

Gas Barrier Layer

In the present invention, in particular when the high-refractive-index layer 3 includes both the transparent electrode layer 3A and the intermediate layer 3B having a refractive index comparable with that of the transparent electrode layer 3A, a part of the high-refractive-index layer 3, e.g., the intermediate layer 3B, or the entire high-refractive-index layer 3 chemically reacts with the transparent electrode layer 3A, thereby possibly resulting in black spot formation during electroluminescent light emission and a short life of the element. Therefore, it is preferable that a gas barrier layer is present between the transparent electrode layer 3A and the intermediate layer 3B.

Examples of material used to form the gas barrier layer include, but not limited to, $ZrC_2$, $TiO_2$, $Al_2O_3$, $CeO_2$, TiN, $Ta_2O_5$, $SiO_xN_y$, SiN, $SiO_x$, $SnO_2$, $Sb_2O_5$, $Y_2O_3$, $La_2O_3$ and $In_2O_3$, and mixture thereof. Any material that shows no absorbance in a visible wavelength region or at least has a dense structure when formed into a film may be used, and the main ingredient of the material is preferably an inorganic compound.

Although thickness of the gas barrier layer is not particularly limited, considering the barrier properties, the thickness is typically 5 nm or more, preferably 20 nm or more, more preferably 50 nm or more, and most preferably 100 nm or more, and at the same time, typically 10 μm or less, preferably 1 μm or less, and more preferably 400 nm or less. For example, it is preferable to provide a gas barrier layer that contains inorganic material and has a thickness of 5 nm to 400 nm, and preferably 10 nm to 300 nm, more specifically, approximately 30 nm.

This gas barrier layer is formed by a vacuum process such as vapor deposition and sputtering. The refractive index of the gas barrier layer is preferably comparable with that of the transparent electrode layer 3A, but low-refractive-index material may also be used as far as the film thickness is 200 nm or less. Examples of such a low-refractive-index material include fluoride such as $MgF_2$, $NaF_2$ and $NaF_2$, and nanoporous materials.

Translucent Body

The translucent body 4 is usually used as a substrate of the electroluminescent element.

The translucent body 4 has a refractive index comparable with or greater than that of the high-refractive-index layer 3, and its refractive index is typically 1.4 or more, preferably 1.45 or more, more preferably 1.47 or more, while being less than 1.9, preferably less than 1.80, and more preferably less than 1.75, but is not particularly limited. The refractive index of the translucent body 4 is determined using optical means such as an ellipsometer, reflection meter and prism coupler.

A transparent substrate formed of commonly used material may be used as the translucent body 4 having such a refractive index. Examples of the transparent substrate include a wide variety of Schott glass such as $BK_7$, $SF_{11}$, $LaSFN_9$, $BaK_1$ and $F_2$; glass such as synthetic fused silica glass, optical crown glass, low-expansion borosilicate glass, sapphire glass, soda glass and non-alkali glass; acryl resins such as polymethyl methacrylate and crosslinked acrylate; aromatic polycarbonate resins such as bisphenol A polycarbonate; polyester resins such as polyethylene terephthalate; amorphous polyolefin resin such as polycycloolefin; epoxy resins; styrene resins such as polystyrene; polysulfone resins such as polyethersulfone; and synthetic resins such as polyetherimide resin, as well as a laminated product thereof. Among these, Schott glass, synthetic fused silica glass, optical crown glass, low-expansion borosilicate glass, soda glass, non-alkali glass, acryl resins, aromatic polycarbonate resins and polysulfone resins are preferred.

In addition, on the light-emitting-surface side of the translucent body 4 (the light-emitting-surface side of the layer having a light-scattering function, described below), an optical film such as an antireflection film, a circular polarizing film or a phase difference film may be formed or laminated depending on its purpose and application.

Thickness of the translucent body 4 is typically 0.1 mm to 10 mm. Considering the mechanical integrity and gas barrier properties, the thickness is preferably 0.2 mm or more. On the other hand, the thickness is preferably 5 mm or less, and more preferably 3 mm or less from the perspective of reducing the weight and ensuring the light transmittance.

The translucent body 4 is preferably a transparent substrate, but a top-emitting device configuration wherein a protective cover instead of the transparent substrate is mounted on the high-refractive-index layer may also be used. In this configuration, it is advisable that the translucent body 4 acts as the protective cover. Material of the protective cover is not particularly limited as far as it is transparent, and thus examples of the material include a wide variety of resin material such as hardening resins and coating material such as sol-gel films.

Layer Having a Light-Scattering Function

On the light-emitting-surface side of the high-refractive-index layer 3 and the translucent body 4, layers having a light-scattering function 5a and 5b are provided.

In this context, the light-scattering function means a capability of multiple scattering of emitted light using Mie scattering. This light-scattering function makes it possible to scatter guided light in the thin film including the electroluminescent layer 2 or leaking light of the guided light in the direction of light emission. Efficient multiple scattering needs appropriate adjustment of differential refractive index between the scattering body or the scattering shape and the matrix around the scattering body or the scattering shape, as well as the size of the scattering body or the scattering shape. For example, the distance between the scattering bodies is preferably comparable with or shorter than the size of each scattering body, and more preferably, ½ of or shorter than the size of each scattering body. Also, the distance between the scattering bodies is preferably 1/10 of or longer than the wavelength. The lengths described above can be determined by surface observation using a scanning electron microscope or a transmission electron microscope, or by an X-ray scattering study.

The scattering body means transparent particles, described later, and the scattering shape means the shape of the textured interface. The matrix particularly means, as for a layer containing the transparent particles, the same matrix as stated in the description of the intermediate layer 3B, and as for the textured interface, it means material, air or others in contact with the textured surface.

In many cases, the light-emitting-surface side of each of the high-refractive-index layer 3 and the translucent body 4 is a surface having a refractive index greatly different from that of the adjacent layer, such as the surface of the high-refractive-index layer 3 in contact with the translucent body 4, and the surface of the translucent body in contact with air.

In particular, the layer having the light-scattering function 5B, which is formed on the light-emitting-surface side of the translucent body 4, preferably has a refractive index higher than that of the translucent body 4 to emit light in the substrate mode efficiently. The preferred differential refractive index between the translucent body 4 and the layer having the light-scattering function 5B is usually 0.02 to 1.5.

The layers having the light-scattering function 5A and 5B may be layers other than each layer included in the high-refractive-index layer 3 and the translucent body 4, or may be formed by texturing the surface of each layer included in the high-refractive-index layer 3 and the translucent body 4 using blast finishing or other polishing processes. In particular, layers containing transparent particles or irregularly textured interfaces are preferred.

In general, thickness of each of the layers having the light-scattering function 5A and 5B in the direction of film thickness is preferably 100 nm or more, and more preferably 200 nm or more. A thickness less than 100 nm reduces multiple scattering performance and increases anisotropy of the scattering, thereby possibly causing view-angle dependence of the brightness to occur. Also, the thickness of each of the layers having the light-scattering function 5A and 5B is preferably 50 μm or less, and more preferably 10 μm or less. A thickness greater than 50 μm causes changes in scattering properties to occur during the emitted light travels along a light path inside the layers having the light-scattering function, thereby possibly resulting in the abovementioned view-angle dependence of the brightness.

In many cases, a preferred light transmittance of the layers having the light-scattering function 5A and 5B is 90% or lower, a more preferred one is 80% or lower, and the most preferred one is 70% or lower. Considering the loss of emitted light due to multiple scattering, the transmittance is preferably 25% or higher, and more preferably 40% or higher. For example, when using a D65 light source, the parallel light transmittance of each of the layers having the light-scattering function 5A and 5B is preferably 30% to 80%.

Layer Having a Light-Scattering Function and Formed of an Irregularly Textured Interface This irregularly textured interface means an interface having a nonperiodic and uneven structure, and the surface roughness Ra of the interface is preferably 10 nm or more and more preferably 100 nm or more, in order to reduce total reflection of the emitted light by the interface. Also, considering leakage of the light, the surface roughness Ra is preferably 10 μm or less, and more preferably 1 μm or less. Although some advanced rough surface structures, such as photonic crystal-based microlenses, have conventionally been proposed, irregularly textured structure of the interface is important not only for cost-cutting but also for reducing anisotropy of scattering. The surface roughness Ra is determined by averaging values measured with 0.5 μm of scan length using P-15 contact surface profiler, manufactured by KLA-Tencor Corporation, according to the standards specified in JIS B0601:2001.

The irregularly textured interface that acts as a layer having the light-scattering function can be obtained by blast finishing or other polishing processes, or otherwise can be formed by applying transparent particles on the interface.

Layer Having a Light-Scattering Function Formed of a Layer Containing Transparent Particles The transparent particles are particles showing no or low absorbance (in general, 30% or lower) in a visible wavelength region, and examples of them include porous substances formed of $TiO_2$, $SiO_2$, $ZrO_2$, $Al_2O_3$, $Ta_2O_3$, $ZnO_2$, $Sb_2O_3$, $ZrSiO_4$, zeolite and combinations thereof, and inorganic particles containing these compounds as the main ingredient, as well as organic particles of acryl resin, styrene resin, polyethylene terephthalate resin and others. Among them, inorganic particles, in particular, those formed of $TiO_2$, $SiO_2$, porous $SiO_2$, $ZrO_2$, $Al_2O_3$ or zeolite are preferred. The transparent particles may be used separately or in combination of two or more kinds.

To make Mie scattering efficiently occur, the particle size is typically 100 nm or more, preferably 250 nm or more, and more preferably 300 nm or more, and at the same time, typically 20 μm or less, and preferably 10 μm or less.

In particular, in the layer having the light-scattering function 5A the particle size is preferably 80 to 700 nm, while in the layer having the light-scattering function 5B the particle size is preferably 150 nm to 8 μm.

Usually the differential refractive index between the matrix and the transparent particles serving as the scattering bodies is preferably 0.01 or more, more preferably 0.03 or more, and most preferably 0.05 or more, and at the same time, preferably less than 2, more preferably less than 1.5, and most preferably less than 1. An excessively small differential refractive index makes it difficult to achieve efficient Mie scattering and an excessively large differential refractive index increases back scattering, so that in these cases the light emission efficiency may be insufficient.

To emit light in the thin film mode, the difference between the refractive index of the matrix ($N_m$) and the transparent particles serving as the scattering bodies ($N_s$), $\Delta N (= N_m - N_s)$, is preferably −1.8 to −0.3. Moreover, the refractive index of the scattering bodies ($N_s$) is preferably 1.8 or more. On the other hand, to emit light in the substrate mode, the differential refractive index between the matrix and the scattering bodies ΔN is preferably −0.3 to 1.5. Moreover, the refractive index of the scattering bodies ($N_s$) is preferably 1.7 or less.

Furthermore, in the present invention, the transparent particles serving as scattering bodies and contained in the layer having the light-scattering function 5A located at the light-emitting-surface side of the high-refractive-index layer 3 have a refractive index of 1.6 or more, and preferably 1.8 or more, while the transparent particles serving as scattering bodies and contained in the layer having the light-scattering function 5B located at the light-emitting-surface side of the translucent body 4 preferably have a refractive index of 1.7 or less, and more preferably 1.57 or less, because it is preferable that scattering properties of the transparent particles are different between the layers having the light-scattering function.

Two or more kinds of transparent particles of different materials or different sizes may be used together. Also, the layer having the light-scattering function formed of a layer containing transparent particles may be laminated layers formed using several kinds of transparent particles and/or matrices.

The layer containing transparent particles is usually a multiple-light-scattering layer formed by applying a coating agent in which the transparent particles have been dispersed in a matrix precursor.

In general, the differential refractive index between the matrix and the transparent particles are, as stated above, preferably 0.01 or more, and more preferably 0.03 or more, and most preferably 0.05 or more, and at the same time, preferably less than 2, more preferably less than 1.5, and most preferably less than 1. Additionally, to emit light in the thin film mode, the difference between the refractive index of the matrix and the transparent particles serving as the scattering bodies ΔN ($=N_m-N_s$) is preferably −1.8 to −0.3, while to emit light in the substrate mode, the differential refractive index between the matrix and the scattering bodies ΔN is preferably −0.3 to 1.5. Therefore, any kind of matrix precursors may be used depending on the kind of transparent particles to be dispersed therein, and examples of material commonly used as the precursors include sol-gel precursors such as silicate oligomer, reactive precursors such as monomers of thermosetting resins and UV-curable resins, molten resins, or precursors containing these as the main ingredient.

The content of transparent particles in the coating agent must be adjusted so as to achieve multiple Mie scattering in the transparent particle-containing layer to be formed.

Examples of methods used to apply such a coating agent include spin-coating, dip-coating, die-coating, casting, spray-coating and gravure-coating. Considering the homogeneity of films, the most preferred method is spin-coating, dip-coating or die-coating.

In the present invention, as reducing the total reflection of the emitted light on the textured interface is important, the textured interface may be an interface having a random structure formed utilizing the differential refractive index.

Other Layers

In the present invention, inserting a layer having a refractive index lower than that of the translucent body 4 (hereinafter, a low-refractive-index layer) between the high-refractive-index layer 3 and the translucent body 4 is preferable, in order to emit the generated light, which has been transferred to the high-refractive-index layer 3, from the translucent body 4 with a high efficiency. The presence of the low-refractive-index layer can make the emitted light directive.

When providing the low-refractive-index layer, a layer that contains silica, fluororesins such as circular Teflon, magnesium fluoride or others and whose refractive index is typically 1.05 or more, and particularly 1.1 or more, and at the same time typically 1.5 or less, preferably 1.35 or less, and more preferably 1.3 or less is suitably used as the low-refractive-index layer, and in particular, a layer containing porous silica is suitable. It is important to ensure that the refractive index of the low-refractive-index layer is smaller than that of the translucent body. However, an excessively low refractive index often leads to an issue concerning the mechanical integrity, while an excessively high-refractive-index reduces the light emission efficiency. In addition, organic components may be optionally introduced to silica for the purposes such as hydrophobization, softening and prevention of cracks. Devices of the top-emitting type can be configured using air (void) as the low-refractive-index layer with no problem. In this case, the refractive index would be 1.0.

[Configuration of the Lighting Apparatus]

The lighting apparatus according to the present invention uses the electroluminescent element of the present invention as its light source.

The electroluminescent element according to the present invention has advantages of reducing decrease in brightness at the edge of image elements, making the emitted light directive, and providing light having uniform intensity as a lighting device, thus being useful as a light source of a lighting apparatus.

The lighting apparatus of the present invention is configured by placing image elements that consist of the electroluminescent elements in front of the subject to be illuminated. In particular, it is preferably used as a sheet-shaped lighting device.

EXAMPLES

The present invention is described in more detail with reference to the following examples, but not limited to these examples as long as it falls within the scope of the invention.

Reference Example 1

A transparent electrode layer is formed on the side other than the light-emitting-surface side of non-alkali glass (refractive index 1.5) manufactured by Asahi Glass Co., Ltd., by sputtering ITO at room temperature so that the film thickness is approximately 100 nm. A hole-injecting layer and a hole-transporting layer are formed, and then a light-emitting layer is formed thereon by vapor deposition of tris(8-hydroxyquinolinate)aluminum complex so that the film thickness is approximately 150 nm. After that, Al is vapor-deposited on the light-emitting layer so that the film thickness is approximately 100 nm to complete an organic electroluminescent element.

While this electroluminescent element emits light, the number of black spots having a diameter of 0.5 mm or larger per 5-cm square is three or less.

Example 1

The light-emitting-surface side of non-alkali glass manufactured by Asahi Glass Co., Ltd. is used as the translucent body (substrate), on which a precursor coating agent prepared by dispersing silica particles SO-G2 (average particle size 600 nm, refractive index 1.5) manufactured by Admatechs in silicate oligomer (refractive index after curing of the oligomer is 1.5) is spin-coated. Then the coating agent is cured at 250° C. to form a light-scattering layer. The surface roughness Ra and light transmittance of this light-scattering layer are approximately 200 nm and approximately 50%, respectively.

On the other side of this glass substrate a porous silica film to be used as the low-refractive-index layer is formed by casting. According to the measurement using a spectral ellipsometer, the film thickness and refractive index of the porous silica film are approximately 830 nm and approximately 1.2, respectively.

On this porous silica film a precursor coating agent prepared by dispersing zirconia particles RC-100 (average particle size 1.9 μm, refractive index 2.0) manufactured by Daiichi Kigenso Kagaku Kogyo Co., Ltd. in silicate oligomer is spin-coated, and then the coating agent is cured at 250° C. to form a light-scattering layer. The surface roughness Ra and light transmittance of this light-scattering layer are approximately 350 nm and 50% (by the light-scattering layer only), respectively.

Furthermore, on the surface of the transparent electrode layer a coating agent prepared by dispersing titania particles TTO-55D (average particle size 30 nm, refractive index 2.4) manufactured by Ishihara Sangyo Kaisha, Ltd. in UV-curable resin UV1000 monomer (refractive index after curing is 1.6) manufactured by Mitsubishi Chemical Corporation is spin-coated, and then the coating agent is cured by UV irradiation to form a high-refractive-index layer. According to the measurement using a prism coupler, the refractive index, film thickness and surface roughness Ra of this composite layer of titania particles and UV-curable resin are approximately 1.8, approximately 10 μm and approximately 1 nm, respectively.

A transparent electrode layer is formed on this composite layer of titania particles and UV-curable resin by sputtering ITO at room temperature so that the film thickness is approximately 100 nm. A hole-injecting layer and a hole-transporting layer are formed, and then a light-emitting layer is formed thereon by vapor deposition of tris(8-hydroxyquinolinate) aluminum complex so that the film thickness is approximately 150 nm. After that, Al is vapor-deposited on the light-emitting layer so that the film thickness is approximately 100 nm to complete an organic electroluminescent element.

The initial brightness of the obtained organic electroluminescent element is approximately 2.5-fold when compared with the light emission efficiency in Reference Example 1. During the electroluminescence, the number of black spots having a diameter of 0.5 mm or larger per 5-cm square is five or less.

Example 2

Non-alkali glass manufactured by Asahi Glass Co., Ltd. is used as the translucent body (transparent substrate), both surfaces of which a precursor coating agent prepared by dispersing silica particles SO-G2 (average particle size 600 nm) manufactured by Admatechs in silicate oligomer is dip-coated. Then the coating agent is cured at 250° C. to form light-scattering layers. The surface roughness Ra and light transmittance (by one layer only) of these light-scattering layers are considered to be similar to those of Example 1.

On the surface of the transparent electrode layer a coating agent prepared by dispersing titania particles TTO-55D (average particle size 30 nm) manufactured by Ishihara Sangyo Kaisha, Ltd. in UV-curable resin UV1000 monomer manufactured by Mitsubishi Chemical Corporation is spin-coated, and then the coating agent is cured to form a high-refractive-index layer. According to the measurement using a prism coupler, the refractive index, film thickness and surface roughness Ra of this composite layer of titania particles and UV-curable resin are approximately 1.8, approximately 7 μm and approximately 2 nm, respectively.

A transparent electrode layer is formed on this composite layer of titania particles and UV-curable resin by sputtering ITO at room temperature so that the film thickness is approximately 100 nm. A hole-injecting layer and a hole-transporting layer are formed, and then a light-emitting layer is formed thereon by vapor deposition of tris(8-hydroxyquinolinate) aluminum complex so that the film thickness is approximately 150 nm. After that, Al is vapor-deposited on the light-emitting layer so that the film thickness is approximately 100 nm to complete an organic electroluminescent element.

The initial brightness of the obtained organic electroluminescent element is approximately 1.8-fold when compared with the light emission efficiency in Reference Example 1.

Example 3

On the porous silica film in Example 1, instead of the precursor coating agent prepared by dispersing zirconia particles in silicate oligomer, a precursor coating agent prepared by dispersing titania particles TS-01 (average particle size 215 nm, refractive index 2.6) manufactured by Showa Denko K.K. and titania particles TTO-55D (average particle size 30 nm) manufactured by Ishihara Sangyo Kaisha, Ltd. in UV-curable resin UV1000 monomer manufactured by Mitsubishi Chemical Corporation is spin-coated, and then the coating agent is cured by UV irradiation to form a light-scattering layer. According to the measurement using a prism coupler, the refractive index, film thickness and surface roughness Ra of this composite layer of titania particles and UV-curable resin are approximately 1.8, approximately 6 μm and approximately 1 nm, respectively. The light transmittance is approximately 70% (by the light-scattering layer only).

A transparent electrode layer is formed on this composite layer of titania particles and UV-curable resin by sputtering ITO at room temperature so that the film thickness is approximately 100 nm. A hole-injecting layer and a hole-transporting layer are formed, and then a light-emitting layer is formed thereon by vapor deposition of tris(8-hydroxyquinolinate) aluminum complex so that the film thickness is approximately 150 nm. After that, Al is vapor-deposited on the light-emitting layer so that the film thickness is approximately 100 nm to complete an organic electroluminescent element.

The initial brightness of the obtained organic electroluminescent element is approximately 2.3-fold when compared with the light emission efficiency in Reference Example 1. During the electroluminescence, the number of black spots having a diameter of 0.5 mm or larger per 5-cm square is five or less.

Reference Example 2

On the side other than the light-emitting-surface side of non-alkali glass (translucent body) manufactured by Asahi Glass Co., Ltd., a transparent electrode layer is formed by sputtering ITO at room temperature so that the film thickness is approximately 130 nm. On this transparent electrode layer, a coating hole-injecting layer and a hole-transporting layer (PPD: p-phenylenediamine) are formed so that the film thickness is 30 nm and 45 nm, respectively, and then a light-emitting layer is formed thereon by vapor deposition of tris (8-hydroxyquinolinate)aluminum complex so that the film thickness is 60 nm, thereby forming an electroluminescent layer. After that, LiF and Al, which are to be used as an electrode (cathode), are vapor-deposited on the electroluminescent layer so that the film thickness is 0.5 nm and 80 nm, respectively, to complete an organic electroluminescent element.

The light emission efficiency of this element is defined as 1, and is used as the standard for comparison with the elements in Examples 4 to 7 and Comparative Examples 1 and 2 below.

Example 4

Preparation of an Element Having an Irregularly Textured Structure on the Surface of the Translucent Body and a Transparent Particle-Containing Layer on the Back Side With blast finishing, an irregularly textured structure was formed on the light-emitting-surface side of non-alkali glass (translucent body) manufactured by Asahi Glass Co., Ltd., and the formed structure was used as the light-scattering layer. The surface roughness Ra and parallel light transmittance of this blast-finished surface were 560 nm and 10%, respectively.

Then, on the side other than the blast-finished surface of this glass substrate (electroluminescent layer side) a precursor coating agent prepared by dispersing rutile titania particles R-61N (average dispersed particle size 250 nm, refractive index 2.6) manufactured by Sakai Chemical Industry Co., Ltd. in UV-curable resin UV1000 monomer manufactured by Mitsubishi Chemical Corporation was spin-coated, and then the coating agent was cured by UV irradiation to form a light-scattering layer. The film thickness, refractive index, surface roughness Ra and parallel light transmittance of this light-scattering layer were 3.5 μm, 1.62, 1.5 nm and 56%, respectively.

The electroluminescent element was thus completed in the same way as Reference Example 2, except for formation of the light-scattering layers on both sides of the glass substrate.

In the observation of a 1-mm square (evaluation condition 1) and a 10-mm square (evaluation condition 2) per 5-mm square light-emitting area, the initial brightness of the obtained organic electroluminescent element was 0.96-fold (evaluation condition 1) and 1.34-fold (evaluation condition 2) when compared with the light emission efficiency in Reference Example 2. Also, decrease in brightness at the edge of elements was reduced and the overall brightness was improved.

Example 5

Preparation of an Element Having Transparent Particle-Containing Layers on Both Sides of the Translucent Body On the light-emitting-surface side of non-alkali glass manufactured by Asahi Glass Co., Ltd. a precursor coating agent prepared by dispersing silica particles SO-G5 (average dispersed particle size 530 nm) manufactured by Admatechs in silicate oligomer was dip-coated, and then the coating agent was cured at 150° C. for 15 minutes and then at 250° C. for 15 minutes to form a light-scattering layer. The surface roughness Ra and parallel light transmittance of the light-scattering layer were 355 nm and 54%, respectively.

Then, on the other side (electroluminescent layer side) of this glass substrate a precursor coating agent prepared by dispersing rutile titania particles R-61N (average dispersed particle size 250 nm, refractive index 2.6) manufactured by Sakai Chemical Industry Co., Ltd. in UV-curable resin UV1000 monomer manufactured by Mitsubishi Chemical Corporation was spin-coated, and then the coating agent was cured by UV irradiation to form another light-scattering layer. The film thickness, refractive index, surface roughness Ra and parallel light transmittance of this light-scattering layer were 3.5 μm, 1.62, 1.5 nm and 56%, respectively.

The electroluminescent element was thus completed in the same way as Reference Example 2, except for formation of the light-scattering layers on both sides of the glass substrate.

In the observation of a 1-mm square (evaluation condition 1) and a 10-mm square (evaluation condition 2) per 5-mm square light-emitting area, the initial brightness of the obtained organic electroluminescent element was 0.99-fold (evaluation condition 1) and 1.39-fold (evaluation condition 2) when compared with the light emission efficiency in Reference Example 2. Also, decrease in brightness at the edge of elements was reduced and the overall brightness was improved.

Example 6

An Element Having a Low-Refractive-Index Layer in Addition to Transparent Particle-Containing Layers on Both Sides of the Translucent Body On the light-emitting-surface side of non-alkali glass manufactured by Asahi Glass Co., Ltd., a light-scattering layer was formed in the same way as the layer formed on the light-emitting-surface side of the substrate in Example 5.

A precursor agent prepared by dissolving Pluronic, triblock copolymer, in partially hydrolyzed alkoxysilane was applied on the other side of the substrate, and then calcined at 450° C. to form a porous silica layer. According to the measurement using a spectral ellipsometer, the film thickness and refractive index at 550 nm wavelength of this porous silica film were 830 nm and 1.15, respectively, and thus this porous silica film was used as the low-refractive-index layer.

Then, on the abovementioned low-refractive-index layer a precursor coating agent prepared by dispersing rutile titania particles R-61N (average dispersed particle size 250 nm) manufactured by Sakai Chemical Industry Co., Ltd. in UV-curable resin UV1000 monomer manufactured by Mitsubishi Chemical Corporation was spin-coated, and then the coating agent was cured by UV irradiation to form a light-scattering layer. The film thickness, refractive index, surface roughness Ra and parallel light transmittance of this light-scattering layer were 3.5 μm, 1.62, 1.5 nm and 56%, respectively.

The electroluminescent element was thus completed in the same way as Reference Example 2, except for formation of the two transparent particle-containing layers and the low-refractive-index layer.

In the observation of a 1-mm square (evaluation condition 1) and a 10-mm square (evaluation condition 2) per 5-mm square light-emitting area, the initial brightness of the obtained organic electroluminescent element was 1.22-fold (evaluation condition 1) and 1.39-fold (evaluation condition 2) when compared with the light emission efficiency in Reference Example 2.

Addition of the low-refractive-index layer in this element made high brightness and forward directivity of the emitted light compatible with each other.

Example 7

An Element Having a Low-Refractive-Index Layer in Addition to Transparent Particle-Containing Layers on Both Sides of the Translucent Body On the light-emitting-surface side of non-alkali glass manufactured by Asahi Glass Co., Ltd., a precursor coating agent prepared by dispersing silica particles SO-G5 (average dispersed particle size 408 nm) manufactured by Admatechs in silicate oligomer was spin-coated, and then the coating agent was cured by UV irradiation to form a light-scattering layer. The surface roughness Ra and parallel light transmittance of the light-scattering layer were 61 nm and 54%, respectively.

Then, a precursor agent prepared by dissolving Pluronic, triblock copolymer, in partially hydrolyzed alkoxysilane was applied on the other side of the substrate, and then calcined at 450° C. to form a porous silica layer. According to the measurement using a spectral ellipsometer, the film thickness and refractive index at 550 nm wavelength of this porous silica film were 830 nm and 1.15, respectively, and thus this porous silica film was used as the low-refractive-index layer.

After that, on the abovementioned low-refractive-index layer a precursor coating agent prepared by dispersing rutile titania particles R-61N (average dispersed particle size 250 nm) manufactured by Sakai Chemical Industry Co., Ltd. in UV-curable resin UV1000 monomer manufactured by Mitsubishi Chemical Corporation was spin-coated, and then the coating agent was cured by UV irradiation to form a light-scattering layer. The film thickness, refractive index, surface roughness Ra and parallel light transmittance of this light-scattering layer were 3.5 µm, 1.62, 1.5 nm and 56%, respectively.

The electroluminescent element was thus completed in the same way as Reference Example 2, except for formation of the two transparent particle-containing layers and the low-refractive-index layer.

In the observation of a 1-mm square (evaluation condition 1) and a 10-mm square (evaluation condition 2) per 5-mm square light-emitting area, the initial brightness of the obtained organic electroluminescent element was 1.17-fold (evaluation condition 1) and 1.50-fold (evaluation condition 2) when compared with the light emission efficiency in Reference Example 2.

Comparative Example 1

An Element Having a Transparent Particle-Containing Layer Only on the Light-Emitting-Surface Side of the Translucent Body The electroluminescent element was completed in the same way as Reference Example 2, except for formation of an additional light-scattering layer on the light-emitting-surface side of the first light-scattering layer by dip-coating of a precursor coating agent prepared by dispersing silica particles SO-G5 (average particle size 408 nm) manufactured by Admatechs in silicate oligomer followed by curing the coating agent at 150° C. for 15 minutes and then at 250° C. for 15 minutes. The surface roughness Ra and parallel light transmittance of the light-scattering layer were 355 nm and 54%, respectively.

In the observation of a 1-mm square (evaluation condition 1) and a 10-mm square (evaluation condition 2) per 5-mm square light-emitting area, the initial brightness of the obtained organic electroluminescent element was 0.91-fold (evaluation condition 1) and 1.00-fold (evaluation condition 2) when compared with the light emission efficiency in Reference Example 2.

Comparative Example 2

An Element Having a Transparent Particle-Containing Layer Only on the Light-Emitting-Surface Side of the High-Refractive-Index Layer The electroluminescent element was completed in the same way as Reference Example 2, except for formation of a light-scattering layer on the electroluminescent layer side of the non-alkali glass manufactured by Asahi Glass Co., Ltd. by spin-coating of a precursor coating agent prepared by dispersing rutile titania particles R-61N (average dispersed particle size 250 nm) manufactured by Sakai Chemical Industry Co., Ltd. in UV-curable resin UV1000 monomer manufactured by Mitsubishi Chemical Corporation followed by curing the coating agent by UV irradiation. The film thickness, refractive index, surface roughness Ra and parallel light transmittance of this light-scattering layer were 3.5 µm, 1.62, 1.5 nm and 56%, respectively.

In the observation of a 1-mm square (evaluation condition 1) and a 10-mm square (evaluation condition 2) per 5-mm square light-emitting area, the initial brightness of the obtained organic electroluminescent element was 1.03-fold (evaluation condition 1) and 1.31-fold (evaluation condition 2) when compared with the light emission efficiency in Reference Example 2. In this element, containment of the guided light traveling inside the substrate resulted in insufficient brightness and inadequate reduction of the decrease in brightness at the edge of elements.

The results obtained in Examples 4 to 7 and Comparative Examples 1 and 2 above are summarized in Table 1 below.

TABLE 1

| | Reference Example | Example | | | | Comparative Example | |
|---|---|---|---|---|---|---|---|
| | 2 | 4 | 5 | 6 | 7 | 1 | 2 |
| Evaluation condition 1 | 1 | 0.96 | 0.99 | 1.22 | 1.17 | 0.91 | 1.03 |
| Evaluation condition 2 | 1 | 1.34 | 1.39 | 1.39 | 1.50 | 1.00 | 1.31 |

The results above, in particular, the data obtained under the evaluation condition 2, show the high light emission efficiency, suggesting that sufficient brightness can be obtained even at the edge of image elements and that uniform light intensity can be achieved even when several image elements are arranged. Therefore, the electroluminescent element of the present invention proved to be useful as a light source used in a lighting apparatus. It was also revealed that addition of a low-refractive-index layer provides the emitted light with directivity.

It is apparent for those skilled in the art that the present invention, which was described in detail using specific examples, can be variously modified within the spirit and scope of the invention.

It should be noted that the present invention is based on a Japanese patent application (Japanese Patent Application No. 2005-69487) filed on Mar. 11, 2005, and its entire disclosure is incorporated herein by reference.

The invention claimed is:

1. An electroluminescent element, wherein an electrode, an electroluminescent layer, a high-refractive-index layer and a translucent body are sequentially laminated; and a layer having a light-scattering function is provided on the light-emitting-surface side of each of the high-refractive-index layer and the translucent body,
  wherein each of the layers having the light-scattering function contains transparent particles;
  the refractive index of the transparent particles contained in the layer having the light-scattering function provided on the light-emitting-surface side of the high-refractive-index layer is 1.6 or more while the refractive index of the transparent particles contained in the layer having the light-scattering function provided on the light-emitting-surface side of the translucent body is 1.7 or less.

2. The electroluminescent element according to claim 1, wherein a layer having a refractive index lower than that of the translucent body is present between the high-refractive-index layer and the translucent body.

3. The electroluminescent element according to claim 2, wherein the refractive index of the layer having a refractive index lower than that of the translucent body is 1.3 or less.

4. The electroluminescent element according to claim 1, wherein the refractive index of the layer having the light-scattering function provided on the light-emitting-surface side of the translucent body is higher than that of the translucent body.

5. The electroluminescent element according to claim 1, wherein the high-refractive-index layer has a transparent electrode layer and an intermediate layer, a difference in a refractive index between the transparent electrode layer and the intermediate layer being less than 0.3.

6. The electroluminescent element according to claim 5, wherein a gas barrier layer is present between the transparent electrode layer and the intermediate layer.

7. The electroluminescent element according to claim 1, which is used as a light source of a lighting apparatus.

8. A lighting apparatus comprising a light source that uses the electroluminescent element according to claim 1.

9. The electroluminescent element according to claim 1, wherein the refractive index of the transparent particles contained in the layer having the light-scattering function provided on the light-emitting-surface side of the high-refractive-index layer is 1.8 or more while the refractive index of the transparent particles contained in the layer having the light-scattering function provided on the light-emitting-surface side of the translucent body is 1.57 or less.

10. The electroluminescent element according to claim 5, wherein the intermediate layer is provided on the light-emitting surface side of the transparent electrode layer.

11. The electroluminescent element according to claim 10, wherein the intermediate layer has insulation properties.

12. The electroluminescent element according to claim 1, wherein the transparent particles are selected from the group consisting of zirconia particles, silica particles and titania particles.

13. The electroluminescent element according to claim 12, wherein the electrode is a transparent ITO layer.

14. The electroluminescent element according to claim 1, wherein the high-refractive-index layer has a refractive index of 1.7 or higher.

15. The electroluminescent element according to claim 1, wherein the high-refractive-index layer has a refractive index of 1.9 or higher.

16. The electroluminescent element according to claim 1, wherein the high-refractive-index layer has a refractive index of 2.0 or higher.

17. The electroluminescent element according to claim 1, wherein the high-refractive-index layer is free of particles.

* * * * *